(12) United States Patent
Tanaka et al.

(10) Patent No.: US 11,309,485 B2
(45) Date of Patent: Apr. 19, 2022

(54) MAGNETOSTRICTIVE MATERIAL AND MAGNETOSTRICTION TYPE DEVICE USING THE SAME

(71) Applicant: Panasonic Intellectual Property Management Co., Ltd., Osaka (JP)

(72) Inventors: Takehiro Tanaka, Hyogo (JP); Kazuki Sakai, Osaka (JP); Taichi Nakamura, Osaka (JP); Ryou Kuwabara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 447 days.

(21) Appl. No.: 16/275,235

(22) Filed: Feb. 13, 2019

(65) Prior Publication Data

US 2019/0292636 A1 Sep. 26, 2019

(30) Foreign Application Priority Data

Mar. 26, 2018 (JP) .............................. JP2018-058319

(51) Int. Cl.
*H01L 41/20* (2006.01)
*C22C 38/00* (2006.01)
*G01L 3/10* (2006.01)

(52) U.S. Cl.
CPC ............ *H01L 41/20* (2013.01); *C22C 38/002* (2013.01); *C22C 38/005* (2013.01); *C22C 2202/02* (2013.01); *G01L 3/103* (2013.01)

(58) Field of Classification Search
CPC ...... C22C 38/002; C22C 38/005; H01L 27/20; H01L 41/00; H01L 41/02; H01L 41/06;
(Continued)

(56) References Cited

U.S. PATENT DOCUMENTS 4,374,665 A * 2/1983 Koon ..................... C22C 45/02
148/302
6,149,736 A * 11/2000 Sukigara ............... H01F 1/0306
148/101

(Continued)

FOREIGN PATENT DOCUMENTS

CN 103556045 A * 2/2014 ............. C22C 38/00
JP 2000252107 A * 9/2000 ............. B82Y 25/00

(Continued)

OTHER PUBLICATIONS

He et al., "Giant heterogeneous magnetostriction in FeGa alloys: Effect of trace element doping", 2016. Acta Materialia, vol. 109, pp. 177-186 (Year: 2016).*

(Continued)

*Primary Examiner* — Keith Walker
*Assistant Examiner* — Benjamin C Anderson
(74) *Attorney, Agent, or Firm* — Wenderoth, Lind & Ponack, L.L.P.

(57) ABSTRACT

A magnetostrictive material includes a FeGaSm alloy that is represented by Expression (1),

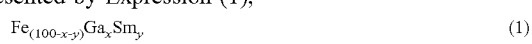

(in Expression (1), x and y are respectively a content rate (at. %) of Ga and a content rate (at. %) of Sm, and satisfy that y≤0.35x−4.2, y≤−x+20.1, and y≥−0.1x+ 2.1).

4 Claims, 2 Drawing Sheets

(58) Field of Classification Search
CPC ....... H01L 41/12; H01L 41/125; H01L 41/16; H01L 41/20; H01L 41/47
See application file for complete search history.

(56) References Cited

U.S. PATENT DOCUMENTS

| | | | | |
|---|---|---|---|---|
| 8,308,874 | B1* | 11/2012 | Clark | H01F 1/047 |
| | | | | 148/306 |
| 2016/0343483 | A1* | 11/2016 | Chopra | C22C 38/002 |
| 2020/0076332 | A1* | 3/2020 | Nakamura | H01L 41/125 |
| 2020/0105997 | A1* | 4/2020 | Nakamura | H01L 41/12 |
| 2020/0274056 | A1* | 8/2020 | Shirotani | H01L 41/125 |

FOREIGN PATENT DOCUMENTS

| | | | |
|---|---|---|---|
| JP | 2003-089857 | | 3/2003 |
| JP | 2008-069434 | | 3/2008 |
| JP | 2021-066627 A | * | 4/2021 |
| JP | 2021-172850 A | * | 11/2021 |

OTHER PUBLICATIONS

Wu et al., "Improved mangetostriction of Fe83Ga17 ribbons doped with Sm", 2016. Rare Metals, vol. 36, No. 1, pp. 18-22 (Year: 2016).*

Golovin etal, "Mechanical spectroscopy of phase transitions in Fe-(23-28)Ga-RE alloys", 2021. Journal of Alloy and Compounds, vol. 874 (Year: 2021).*

* cited by examiner

MAGNETOSTRICTIVE MATERIAL AND MAGNETOSTRICTION TYPE DEVICE USING THE SAME

TECHNICAL FIELD

The technical field relates to a magnetostrictive material which is formed of a FeGaSm alloy, and a magnetostriction type device using the same.

BACKGROUND

In recent years, it is expected that the world in which things having autonomous communication functions perform information interchanges, and automatically perform mutual controls, that is, the world of Internet of things (IoT) arrives. If the IoT infiltrates into a society, IoT devices having the communication functions will appear on the market in large quantities. There will be a need for a power source in order to operate the IoT device such as a sensor. However, if the number of devices becomes enormous, it is difficult to secure the power source in terms of wiring, maintenance time, and cost. Therefore, a power supply technology which is suitable for the IoT device is demanded in realization of the IoT. Based on such a background, "energy harvesting" which is a technology of utilizing micro energy that is present everywhere in our surroundings by converting the micro energy into power is being considered. Since a vibration which is one of energy sources is necessarily generated whenever an automobile, a railroad, a machine, or a person moves, the vibration is an energy source of which many generation spots are present, and which is not affected by weather and climate. Therefore, it is considered that construction of a system in which the power supply of an application coupled with the movement of the moving bodies is provided by vibration power generation may be a clue to the realization of the IoT.

Power generation methods of the vibration power generation are classified into four kinds: a magnetostriction type; a piezoelectric type; an electrostatic induction type; and an electromagnetic induction type. The magnetostriction type is a method for converting a magnetic flux which leaks to an outside in accordance with a change of an internal magnetic field of a magnetostrictive material by applying stress into electricity through a wound coil. Since internal resistance of the magnetostriction type is smaller than those of other methods, a power generation quantity is large. Since a metal alloy is used as a magnetostrictive material, the magnetostriction type has a feature of being excellent in durability. Therefore, the magnetostriction type may be expected as a method that is capable of improving the durability which is one of problems of the vibration power generation device.

On the other hand, as a magnetostrictive material of the vibration power generation device, a material of FeGa (galfenol)-based alloy is developed. Since the FeGa-based alloy does not include a rare earth element in the material thereof, and has a large magnetostriction quantity, the FeGa-based alloy is expected to be used as a sensor or an actuator. For example, Japanese Patent Unexamined Publication No. 2008-69434 discloses a magnetostrictive material of a FeGaAl-based alloy which is used in a magnetostriction type torque sensor for a vehicle.

Specifically, the magnetostriction type torque sensor using an alloy which includes B of 1 to 2 at. %, Al of 4 to 7 at. %, Ga of 12 to 14 at. %, and a balance of Fe is described in Japanese Patent Unexamined Publication No. 2008-69434. Regarding the FeGaAl-based alloy, an additional element, an addition quantity thereof, a structure, a heat treatment, and the like are appropriately controlled, thereby, it is possible to improve mechanical strength of the magnetostrictive material which is formed of the alloy.

SUMMARY

However, in the current magnetostriction type vibration power generation device, power generation density (power generation quantity per volume) is small, and it is not possible to realize miniaturization which may achieve the realization of the IoT. For a practical use, there is a need to improve the power generation density of the device, by improving the magnetostriction quantity of the magnetostrictive material that is in a relationship which is proportional to the power generation density. For example, in a case where the magnetostriction type vibration power generation device is applied to a tire pressure monitoring system or a sensor network in a factory, power consumption density of approximately 0.3 mW/cm$^3$ is obtained, and there is a need to be 400 ppm or greater as a magnetostriction quantity. The magnetostrictive material described in Japanese Patent Unexamined Publication No. 2008-69434 is excellent in mechanical strength, but has small magnetostriction quantity of approximately 50 ppm, thereby, it is not possible to realize the miniaturization as a vibration power generation device.

An object of the present disclosure is to provide a magnetostrictive material which exhibits a large magnetostriction quantity, and is excellent in mechanical strength.

According to an aspect of the present disclosure, there is provided a magnetostrictive material including a FeGaSm alloy that is represented by Expression (1),

$$Fe_{(100-x-y)}Ga_xSm_y \qquad (1)$$

(in Expression (1), x and y are respectively a content rate (at. %) of Ga and a content rate (at. %) of Sm, and satisfy that y≤0.35x−4.2, y≤−x+20.1, and y≥−0.1x+2.1).

In the aspect of the present disclosure, in Expression (1), x and y may satisfy that 17≤x≤18 and 0.7≤y≤1.4.

In the aspect of the present disclosure, an orientation difference of <100> orientation of the FeGaSm alloy may be in a range of 0° or greater and 10° or less, with respect to a maximum strain direction of the magnetostrictive material.

According to another aspect of the present disclosure, there is provided a magnetostriction type device including the magnetostrictive material described above, in which a maximum strain direction of the magnetostrictive material is configured to form an inclination angle of 0° or greater and 10° or less, with respect to a predetermined direction of a dimensional change of the magnetostriction type device.

According to the present disclosure, a magnetostrictive material which exhibits a large magnetostriction quantity, and is excellent in mechanical strength is provided.

DESCRIPTION OF EMBODIMENTS

Figure 1:
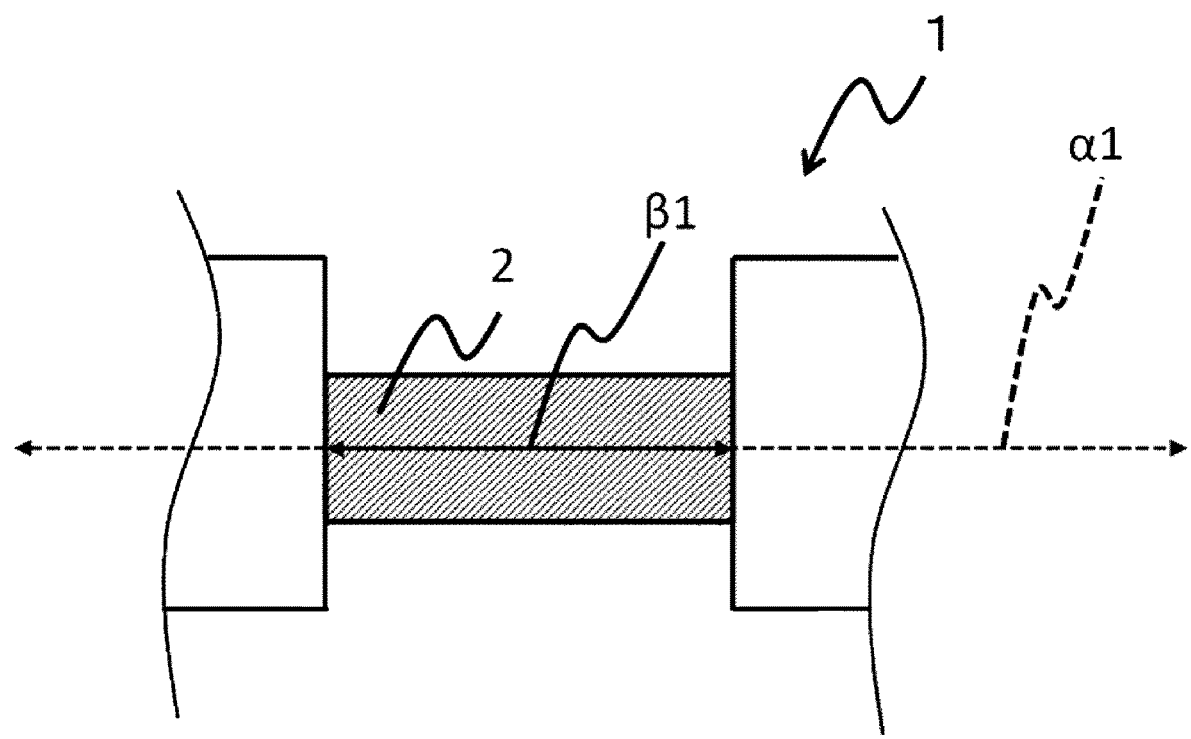
FIG. 1 is a schematic diagram when one example in which a maximum strain direction of a magnetostrictive material is configured to form an inclination angle of 0°, with respect to a predetermined direction of a dimensional change of a magnetostriction type device according to an embodiment is viewed from above.

Hereinafter, a magnetostrictive material, a method for manufacturing the same, and a magnetostriction type device according to an embodiment of the present disclosure will be described, but the present disclosure is not limited to such an embodiment.

Magnetostrictive Material and Magnetostriction Type Device

The magnetostrictive material according to the present embodiment includes a FeGaSm alloy that is represented by Expression (1),

$$Fe_{(100-x-y)}Ga_xSm_y \qquad (1)$$

(in Expression (1), x and y are respectively a content rate (at. %) of Ga and a content rate (at. %) of Sm, and satisfy that $y \leq 0.35x-4.2$, $y \leq -x+20.1$, and $y \geq -0.1x+2.1$).

In the present disclosure, a material in which a dimensional change may be generated by applying a magnetic field is referred to as a "magnetostrictive material". The magnetostrictive material of the present embodiment may have any suitable form or shape so long as the magnetostrictive material is formed of the FeGaSm alloy described above. The magnetostrictive material may have any suitable shape, may have a bulk shape (or a massive shape), for example, a cylindrical shape, a cubic shape, a rectangular parallelepiped shape, or other three-dimensional shapes, or may be a sheet (thin film shape, thin band shape, or the like) that may have a sheet shape, for example, a circular shape, an elliptical shape, a rectangular shape, or other planar shapes (or surfaces).

In the present disclosure, the "content rate" of an element is a proportion of the number of atoms of each element to the number of atoms of the whole FeGaSm alloy, and is represented using a unit of at. % (atomic percent). In more detail, the FeGaSm alloy is analyzed with an electron probe micro analyzer (EPMA), thereby, it is possible to measure the content rate of each element.

In the magnetostrictive material of the present embodiment, composition of the FeGaSm alloy may include a trace element (for example, oxygen that is less than 0.005 at. %) which is inevitably mixed so long as being substantially configured by the exemplified element.

In the magnetostrictive material according to the present embodiment, it is possible to realize high magnetostriction quantification, due to an influence on local strain that is caused by adding Sm of which an atomic radium is larger than that of Fe or Ga to the composition of a FeGa alloy, and magneto crystalline anisotropy that is caused by quadrupole moment of a 4f electron which the added Sm has. The content rate of Sm in the FeGaSm alloy is in a range ($y \leq 0.35x-4.2$, $y \leq -x+20.1$, and $y \geq -0.1x+2.1$, see FIG. 3 described later) that is represented by the expression described above, thereby, for the reason of the influence on the local strain and the magneto crystalline anisotropy, it is possible to realize improvement of the magnetostriction quantity, and it is possible to maintain mechanical strength, in comparison with a FeGaAl-based alloy of the related art as described in Japanese Patent Unexamined Publication No. 2008-69434.

A proportion of the dimensional change due to a magnetostriction effect in the magnetostrictive material is referred to as a magnetostriction quantity. In more detail, in the present disclosure, the magnetostriction quantity (ppm) is represented by a value obtained by subtracting strain that is measured when the magnetic field is applied perpendicularly to a gauge axis of a strain gauge, from the strain of a sample when the magnetic field is applied parallel to the gauge axis of the strain gauge.

In the magnetostrictive material according to the present embodiment, in Expression (1), x and y satisfy that $17 \leq x \leq 18$, and $0.7 \leq y \leq 1.4$ (see FIG. 4 described later), thereby, it is possible to realize the high magnetostriction quantification more effectively.

In the present embodiment, the FeGaSm alloy may have any crystal structure, and may have, for example, a monocrystalline structure or a polycrystalline structure.

In the present embodiment, for example, it is possible to make an orientation difference of <100> orientation of the FeGaSm alloy be in the range of 0° or greater and 10° or less, with respect to a maximum strain direction of the magnetostrictive material. Such an orientation difference is preferably 0° or greater and 8° or less, more preferably 0° or greater and 6° or less, and further preferably 0° or greater and 4° or less.

By making the magnetostrictive material be in a crystal state in this manner, it is possible to favorably and easily obtain magnetostrictive properties more efficiently, and the magnetostrictive material may be more appropriately used when being used in the magnetostriction type device described later. This is considered that the present disclosure is not bound by any theory, but the <100> orientation is an orientation which is likely to be magnetized in the FeGaSm alloy, and the magnetostrictive properties are obtained more efficiently, by making the orientation difference of the <100> orientation of the FeGaSm alloy with respect to the maximum strain direction of the magnetostrictive material be in the range of 10° or less as small as possible (for example, the larger magnetostriction quantity is obtained by applying the same magnetic field, or the same magnetostriction quantity is obtained by applying the smaller magnetic field, in comparison with a case where the orientation difference described above exceeds 10°).

In the present disclosure, the "maximum strain direction of the magnetostrictive material" means a direction in which the strain (dimensional change proportion) of the magnetostrictive material becomes the maximum in a case where the magnetic field is applied to the magnetostrictive material that may have any shape (in a case where the crystal structure of the magnetostrictive material is not clear, for example, the "maximum strain direction of the magnetostrictive material" is capable of being determined in trial and error manner, by measuring the strain in any direction of the magnetostrictive material while appropriately adjusting an applying direction of the magnetic field). In the present disclosure, the orientation difference of the <100> orientation of the FeGaSm alloy may be determined by a known method, with respect to the maximum strain direction of the magnetostrictive material, and may be determined by, for example, an electron backscatter diffraction (EBSD) method. In more detail, it is possible to determine such an orientation difference, by applying a crystal orientation map due to the EBSD method to the surface of the FeGaSm alloy of the magnetostrictive material according to the present embodiment, and measuring a distribution condition of the <100> orientation with respect to the maximum strain direction (this is understood as a sample direction, or a specified direction in a sample coordinate system) of the magnetostrictive material (the surface may be a surface which the magnetostrictive material originally has, or may be a surface which is exposed when the crystal orientation map is applied, and may be selected in accordance with the maximum strain direction of the magnetostrictive material). Specifically, for example, "the orientation difference of the <100> orientation of the FeGaSm alloy is in the range of 0° or greater and 10° or less, with respect to the maximum strain direction of the magnetostrictive material" means that at the time of this measurement, in a case where a measuring point in which the <100> orientation with respect to the maximum strain direction of the magnetostrictive material is oriented to be 0° or greater and 10° or less is sought, the proportion of such measuring points to the measuring points in a measurable area is 100%, that is, in all measuring points of the measurable area, the <100> orientation with respect to the maximum strain direction of the magnetostrictive material is oriented to be 0° or greater and 10° or less. Other numerical value ranges relating to the orientation difference may be understood in the same manner.

In the present embodiment, the magnetostriction type device including the magnetostrictive material as described above is also provided. In the present disclosure, the "magnetostriction type device" indicates a device that includes the magnetostrictive material described above, in more detail, includes the magnetostrictive material as a configuration element (for example, a magnetostriction element), and has a structure which may extract energy (for example, power generation energy) using the same. Specifically, for example, various kinds of magnetostriction type apparatuses such as a magnetostriction type vibration power generation device, a magnetostriction type sensor, and a magnetostriction type actuator are cited. In the devices, the magnetostrictive material is included as a portion thereof in a structure and/or a shape suitable for each apparatus.

In the magnetostriction type device according to the present embodiment, the maximum strain direction of the magnetostrictive material may be configured to form an inclination angle of 0° or greater and 10° or less, with respect to a predetermined direction of the dimensional change of the magnetostriction type device. The inclination angle is more preferably 0° or greater and 8° or less, further preferably 0° or greater and 6° or less, and more further preferably 0° or greater and 4° or less.

The magnetostriction type device is configured with such an inclination angle, thereby, it is possible to obtain the magnetostrictive properties more efficiently. This is because it is possible to use the magnetostrictive properties of the magnetostrictive material more efficiently, by making the inclination angle between the maximum strain direction of the magnetostrictive material and the predetermined direction of the dimensional change of the magnetostriction type device be in the range of 10° or less as small as possible (for example, it is possible to use the larger magnetostriction quantity for the device by applying the same magnetic field, or it is possible to use the same magnetostriction quantity for the device by applying the smaller magnetic field, in comparison with a case where the inclination angle described above exceeds 10°).

In the present disclosure, the predetermined direction of the dimensional change of the magnetostriction type device is a direction in which the dimensional change of the magnetostrictive material is predetermined or desired in the magnetostriction type device, for example, in order to extract the energy from the magnetostriction type device, and is a direction that may be determined in accordance with the applying direction of the magnetic field to the magnetostrictive material in the magnetostriction type device, and the shape, the structure and/or a use purpose of the magnetostriction type device. In the present disclosure, the inclination angle of the maximum strain direction of the magnetostrictive material is determined in a state where the magnetostrictive material is incorporated into the magnetostriction type device, with respect to the predetermined direction of the dimensional change of the magnetostriction type device.

Figure 2:
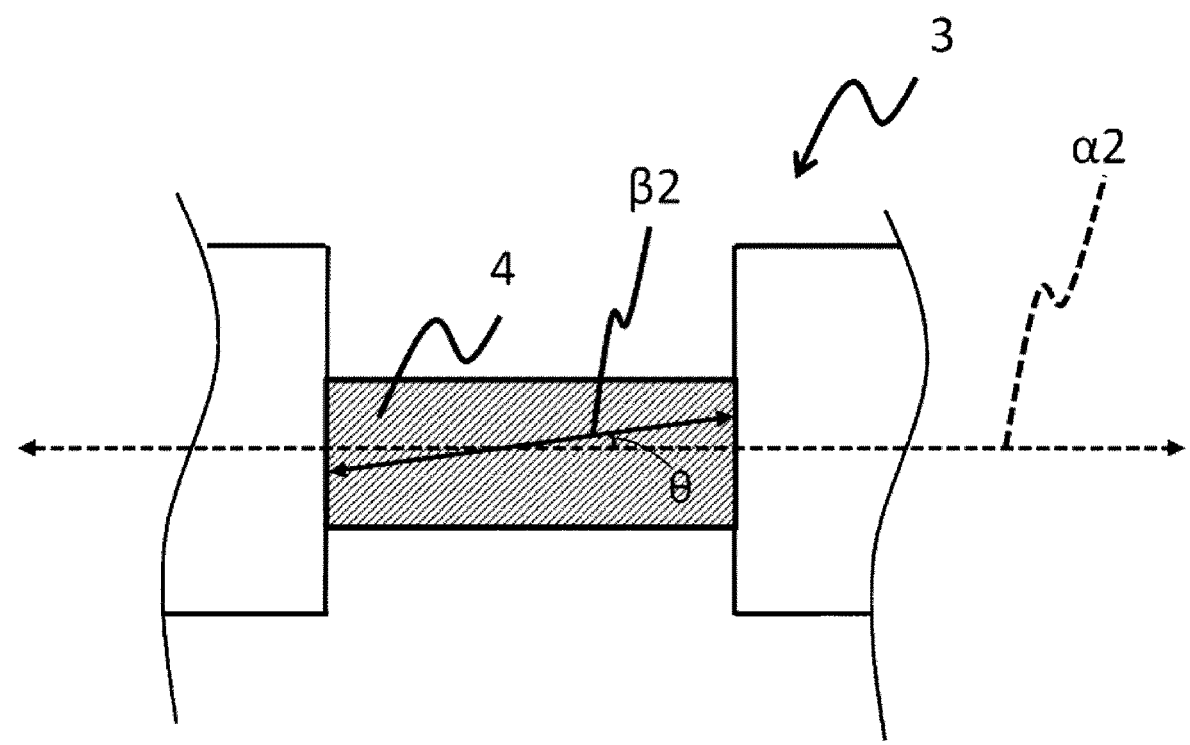
FIG. 2 is a schematic diagram when one example in which the maximum strain direction of the magnetostrictive material is configured to form the inclination angle of θ, with respect to the predetermined direction of the dimensional change of the magnetostriction type device according to the embodiment is viewed from above.

A specific example of the magnetostriction type device will be described with reference to drawings. FIG. 1 is a schematic diagram when one example in which the maximum strain direction of the magnetostrictive material is configured to form the inclination angle of 0°, with respect to the predetermined direction of the dimensional change of the magnetostriction type device according to the embodiment is viewed from above. As illustrated in FIG. 1, in magnetostriction type device 1, maximum strain direction β1 of magnetostrictive material 2 which is determined by the method described before becomes parallel, that is, forms the inclination angle of 0°, with respect to predetermined direction α1 of the dimensional change thereof. FIG. 2 is a schematic diagram when one example in which the maximum strain direction of the magnetostrictive material is configured to form the inclination angle of θ, with respect to the predetermined direction of the dimensional change of the magnetostriction type device according to the embodiment is viewed from above. As illustrated in FIG. 2, in magnetostriction type device 3, maximum strain direction β2 of magnetostrictive material 4 which is determined by the method described before forms the inclination angle of θ, with respect to predetermined direction α2 of the dimensional change thereof. In this case, θ may form the inclination angle of 0° or greater and 10° or less, as described before. A configuration with such an inclination angle may be made, thereby, it is possible to obtain the magnetostrictive properties by the magnetostrictive material more efficiently.

Method for Manufacturing Magnetostrictive Material

It is possible to use any suitable alloy manufacturing method so long as a method for manufacturing the magnetostrictive material according to the present embodiment is a method for obtaining the magnetostrictive material of the FeGaSm alloy, and the method for manufacturing the magnetostrictive material according to the present embodiment is not particularly limited. For example, Czochralski method (CZ method), Bridgman method, a rapid solidification method, or the like is cited. If the manufacturing is performed by the CZ method, it is possible to accurately manufacture chemical composition and crystal orientation, in a large-sized crystal.

EXAMPLES

Hereinafter, the present disclosure will be described in more detail by Examples and Comparative Examples, but the present disclosure is not limited to Examples.

Example 1

In Example 1, a sample of a FeGaSm alloy in which Sm is added to a FeGa alloy is manufactured, measurements in mechanical strength and magnetostriction quantity are performed, and effectiveness of addition of Sm is confirmed.

Manufacturing of Sample for Measurement of FeGaSm Alloy

As illustrated in Table 1 later, a plurality of samples (Example 1-1 to Example 1-3, and Comparative Example 1-1 to Comparative Example 1-3) of the FeGaSm alloys which are configured by the content rate (at. %) of Ga, the content rate (at. %) of Sm, and the content rate (at. %) of a balance Fe are prepared.

In order to manufacture each alloy sample, first, Fe (purity of 99.999%), Ga (purity of 99.999%), and Sm (purity of 99.99%) are respectively weighed using an electronic balance. The content rate of each element in each alloy sample is measured and adjusted by an EPMA analysis.

Each alloy sample is grown using a high-frequency induction heating type CZ furnace. A crucible of an outer diameter of $\phi45$ mm which is made of dense alumina is disposed on an inside of a graphite crucible of an inner diameter of $\phi50$ mm, and 400 g of a raw material of Fe, Ga, and Sm is put into each weighed alloy sample. After the crucible into which the raw material is put is put into a growth furnace, and vacuum is made in the furnace, an argon gas is introduced thereto. Thereafter, the heating of the apparatus is started, in a time point at which the inside of the furnace reaches atmospheric pressure, and the heating is performed for 12 hours, until a melting liquid is made. FeGa single crystal which is cut out in the <100> orientation is used as a seed crystal, and the seed crystal descends close up to the melting liquid. The seed crystal gradually descends while rotating at 5 ppm, and a tip of the seed crystal is in contact with the melting liquid. While a temperature is gradually decreased, thereafter, the seed crystal is increased at a speed of which a pulling-up speed is 1.0 mm/hr, and a crystal growth is performed. As a result, a single crystal alloy of which a diameter is 10 mm, and a length of a straight body is 80 mm is obtained. The obtained single crystal alloy is cut out into each sample shape for the measurement described hereinafter, by wire electric discharge machining.

Measurement of Mechanical Strength (Tensile Strength (MPa) and Elongation (%))

The measurement of the mechanical strength is performed under a room temperature environment (25° C.) using a tensile tester. The sample for the measurement is a specimen of a dumbbell shape, and a fixer thereof is set to be the diameter of 6 mm×the length of 20 mm, and a neck thereof is set to be the diameter of 3 mm×the length of 20 mm. A distance between gripers of the tester is set to 20 mm, and load is applied in an axis direction until the specimen is broken, after the specimen is fixed. Elongation (%) is a proportion of an increment of the distance between the grippers at the time of the breakage to 20 mm of the distance between the grippers before the test. For example, in a case where the distance between the grippers at the time of breaking the specimen is 40 mm, the elongation is that (40−20)/20×100=100(%).

Measurement of Magnetostriction Quantity (ppm)

The measurement of the magnetostriction quantity is performed under the room temperature environment (25° C.), by a strain gauge method which is generally used. A vibrating material type magnetometer is used in a magnetic field generation apparatus. The strength of the magnetic field is 5000 Oe. As a sample for the measurement, a sample obtained by cutting out the single crystal alloy (the diameter of 10 mm×the length of the straight body of 80 mm) described above into the shape of the diameter of 10 mm×a thickness of 1 mm is used. At this time, the <100> orientation which is an easy axis of magnetization of the crystal is cut out to be a thickness direction of the sample. That is, an upper surface direction and a bottom surface directions of the sample of which the diameter is 10 mm, and the thickness direction of 1 mm are made 0°, with respect to the <100> orientation of the FeGaSm alloy. The strain gauge is attached to the upper surface of the sample of which the diameter is 10 mm. At this time, the strain gauge is attached to be parallel to the <100> orientation of the FeGaSm alloy. In other words, the properties of the magnetostriction quantity of the sample are measured to be parallel to the maximum strain direction (to form the inclination angle of 0°), with respect to the pulling-out direction of magnetostrictive energy. The strain ($\lambda_{//}$) of the sample when the magnetic field is applied parallel to the gauge axis of the strain gauge, and the strain ($\lambda_\perp$) of the sample when the magnetic field is applied perpendicularly to the gauge axis of the strain gauge are recorded with a data logger. Magnetostriction quantity $\lambda$ (ppm) is calculated as $\lambda$ (ppm)=$\lambda_{//}-\lambda_\perp$, and is evaluated, from the recorded numerical values.

Table 1 illustrates measurement results of the mechanical strength (tensile strength and elongation) and the magnetostriction quantity, in conjunction with the alloy composition of each sample of the FeGaSm alloy in Example 1-1 to Example 1-3, and Comparative Example 1-1 to Comparative Example 1-3.

TABLE 1

| | Fe [at. %] | Ga [at. %] | Sm [at. %] | Tensile Strength [MPa] | Elongation [%] | Magnetostriction Quantity [ppm] |
|---|---|---|---|---|---|---|
| Example 1-1 | 83.3 | 16 | 0.7 | 353 | 1 | 432 |
| Example 1-2 | 83 | 16 | 1 | 364 | 1.1 | 461 |
| Example 1-3 | 82.6 | 16 | 1.4 | 351 | 1 | 420 |
| Comparative Example 1-1 | 83.3 | 16.7 | 0 | 342 | 1 | 298 |
| Comparative Example 1-2 | 83 | 17 | 0 | 351 | 1.1 | 307 |
| Comparative Example 1-3 | 82.6 | 17.4 | 0 | 350 | 1.1 | 295 |

As illustrated in Table 1, in Example 1-1 to Example 1-3 in which Sm is added to the FeGa alloy, the magnetostriction quantity is 400 ppm or greater, while the same mechanical strength is maintained (the tensile strength is approximately 350 MPa, and the elongation is approximately 1%), in comparison with Comparative Example 1-1 to Comparative Example 1-3 in which Sm is not added. This is considered that the magnetostriction quantity is improved due to the influence on the local strain that is caused by the addition of Sm, and the magneto crystalline anisotropy that is caused by the quadrupole moment of the 4f electron. Accordingly, it is found out that the addition of Sm is effective in order to improve the magnetostriction quantity while maintaining the mechanical strength.

Example 2

In Example 2, various samples in which the content rate (at. %) of Sm is changed in the FeGaSm alloy are prepared, the magnetostriction quantity is measured, and the range of the content rate (at. %) of Sm in which the addition of Sm becomes effective is clarified.

Manufacturing of Sample for Measurement of FeGaSm Alloy

As a sample for the measurement, as illustrated in Table 2 later, the plurality of samples (Example 2-1 to Example 2-15, and Comparative Example 2-1 to Comparative Example 2-9) of the FeGaSm alloys which are configured by the content rate (at. %) of Ga, the content rate (at. %) of Sm, and the balance Fe (the numerical value thereof is not illustrated in Table 2) are prepared. The method for manufacturing the sample for the measurement of the FeGaSm single crystal alloy, and the method (wire electric discharge machining) for cutting out the sample for the measurement are the same as those of Example 1 described above.

Measurement and Determination of Magnetostriction Quantity (ppm)

The shape of the sample for the measurement of the magnetostriction quantity (ppm) of each sample, and a measurement method thereof are the same as those of Example 1 described above. In a case where the magnetostrictive material is used for the vibration power generation device, if the magnetostriction quantity is less than 400 ppm, power generation density is less than 0.3 mW/cm³. Therefore, the effectiveness of the magnetostriction quantity (ppm) is determined to be "Good" in a case of 400 ppm or greater, and is determined to be "Poor" in a case of less than 400 ppm. In a case where the magnetostrictive material is used for a torque sensor, if the magnetostriction quantity is 480 ppm or greater, output sensitivity of 1 V/Nm or greater is obtained, and it is possible to use the torque sensor of the magnetostriction material in an electric assist bicycle or the like. Therefore, the sample of which the magnetostriction quantity is 480 ppm or greater is determined to be "Excellent".

Table 2 illustrates the measurement result and a determination result of the magnetostriction quantity, in conjunction with the alloy composition of each sample of the FeGaSm alloy in Example 2-1 to Example 2-15, and Comparative Example 2-1 to Comparative Example 2-9.

TABLE 2

| | Ga [at. %] | Sm [at. %] | Magnetostriction Quantity [ppm] | Determination |
|---|---|---|---|---|
| Example 2-1 | 20 | 0.1 | 415 | Good |
| Example 2-2 | 17 | 0.4 | 433 | Good |
| Example 2-3 | 19.7 | 0.4 | 417 | Good |
| Example 2-4 | 14 | 0.7 | 419 | Good |
| Example 2-5 | 16 | 0.7 | 432 | Good |
| Example 2-6 | 17 | 0.7 | 491 | Excellent |
| Example 2-7 | 18 | 0.7 | 483 | Excellent |
| Example 2-8 | 19.4 | 0.7 | 421 | Good |
| Example 2-9 | 16 | 1 | 461 | Good |
| Example 2-10 | 17.5 | 1 | 516 | Excellent |
| Example 2-11 | 16 | 1.4 | 420 | Good |
| Example 2-12 | 17 | 1.4 | 484 | Excellent |
| Example 2-13 | 18 | 1.4 | 487 | Excellent |
| Example 2-14 | 18.7 | 1.4 | 425 | Good |
| Example 2-15 | 18 | 2.1 | 421 | Good |
| Comparative Example 2-1 | 19 | 0.1 | 389 | Poor |
| Comparative Example 2-2 | 20.7 | 0.1 | 375 | Poor |
| Comparative Example 2-3 | 16 | 0.4 | 392 | Poor |
| Comparative Example 2-4 | 13 | 0.7 | 377 | Poor |
| Comparative Example 2-5 | 20.1 | 0.7 | 381 | Poor |
| Comparative Example 2-6 | 15.3 | 1.4 | 390 | Poor |
| Comparative Example 2-7 | 19.4 | 1.4 | 393 | Poor |
| Comparative Example 2-8 | 17 | 2.1 | 390 | Poor |
| Comparative Example 2-9 | 18.7 | 2.1 | 388 | Poor |

As illustrated in Table 2, the magnetostriction quantities of Example 2-1 to Example 2-15 are 400 ppm or greater, and all the determinations thereof are "Excellent" or "Good". This is considered to be due to the influence on the local strain that is caused by the addition of Sm, and the magneto crystalline anisotropy that is caused by the quadrupole moment of the 4f electron.

In a case where the content rate of Ga is 19 at. %, and the content rate of Sm is 0.1 at. % in Comparative Example 2-1, in a case where the content rate of Ga is 16 at. %, and the content rate of Sm is 0.4 at. % in Comparative Example 2-3, and in a case where the content rate of Ga is 13 at. %, and the content rate of Sm is 0.7 at. % in Comparative Example 2-4, the magnetostriction quantity is less than 400 ppm, and the determination becomes "Poor". This is considered because it is not possible to express the sufficient magnetostriction quantity improvement effect, since the content rate of Sm is small.

In a case where the content rate of Ga is 20.7 at. %, and the content rate of Sm is 0.1 at. % in Comparative Example 2-2, in a case where the content rate of Ga is 20.1 at. %, and the content rate of Sm is 0.7 at. % in Comparative Example 2-5, in a case where the content rate of Ga is 19.4 at. %, and the content rate of Sm is 1.4 at. % in Comparative Example 2-7, and in a case where the content rate of Ga is 18.7 at. %, and the content rate of Sm is 2.1 at. % in Comparative Example 2-9, the magnetostriction quantity is less than 400 ppm, and the determination becomes "Poor". This is considered that the total content rate of Ga and Sm is as high as 20.8 at. %, and the crystal structure is changed to an ordered phase (D03, L12) from a disorder bcc phase, thereby, the magnetostriction quantity is lowered.

In a case where the content rate of Ga is 15.3 at. %, and the content rate of Sm is 1.4 at. % in Comparative Example 2-6, and in a case where the content rate of Ga is 17 at. %, and the content rate of Sm is 2.1 at. % in Comparative Example 2-8, the magnetostriction quantity is less than 400 ppm, and the determination becomes "Poor". This is considered that the magnetostriction quantity is lowered by of appearance of the second phase, since Sm is added beyond a solid solubility limit.

For example, if Example 2-2 or Example 2-3 is compared with Comparative Example 2-3, or Example 2-11 to Example 2-14 are compared with Comparative Example 2-6, even in a case of the same content rate of Sm, the content rate of Ga is low, and the magnetostriction quantity is less than 400 ppm. This is considered to be caused by the fact that the magnetostriction quantity is lowered as the content rate of Ga is lowered, in a FeGa-based alloy (of which the content rate of Ga is 20 at. % or less).

Figure 3:
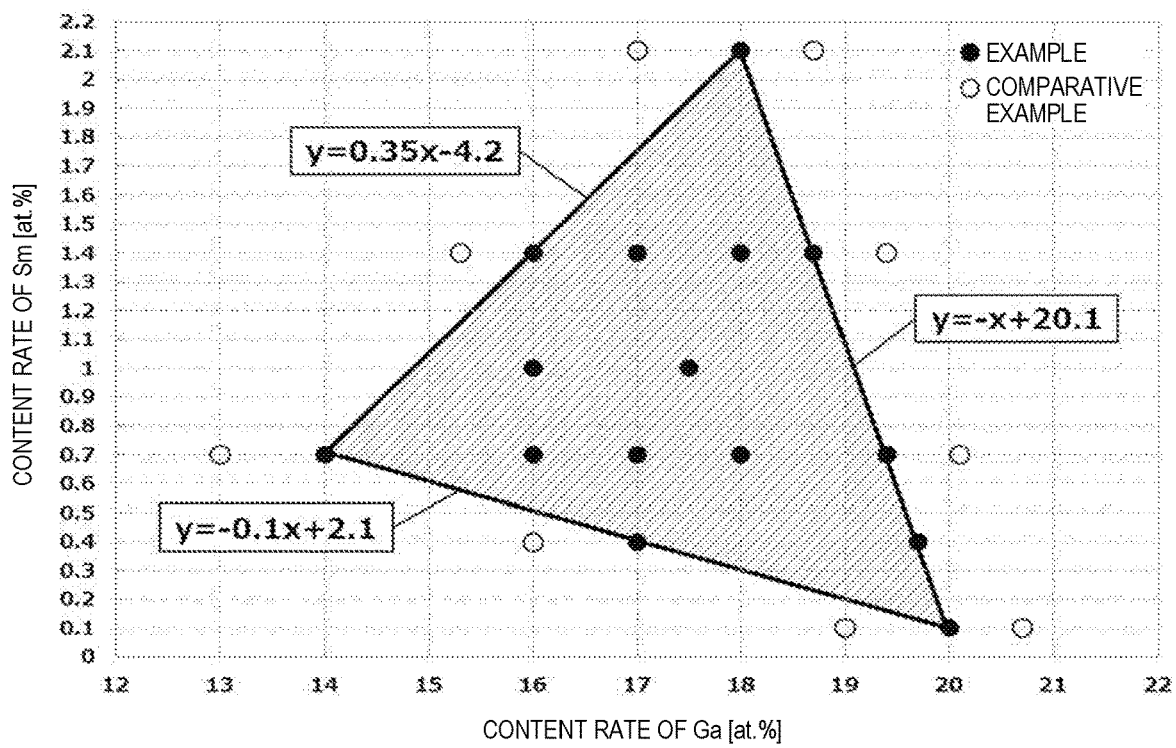
FIG. 3 is a diagram representing a relationship between a content rate of Ga and a content rate of Sm in which a magnetostriction quantity becomes 400 ppm or greater in Example 2 of the present disclosure.

FIG. 3 is a diagram representing a relationship between the content rate of Ga and the content rate of Sm in which the magnetostriction quantity becomes 400 ppm or greater in Example 2 of the present disclosure. A vertical axis indicates the content rate (at. %) of Sm, and a horizontal axis indicates the content rate (at. %) of Ga. A black circle represents a spot at which the magnetostriction quantity is 400 ppm or greater in Example 2-1 to Example 2-15. A white circle represents a spot at which the magnetostriction quantity is less than 400 ppm in Comparative Example 2-1 to Comparative Example 2-9. As illustrated in FIG. 3, a boundary at which the magnetostriction quantity is 400 ppm or greater is present, in the relationship between the content rate of Sm and the content rate of Ga. If approximate lines along the boundary are sought, it is found out that y=0.35x−4.2, y=−x+20.1, and y=−0.1x+2.1, respectively. In other words, if the content rate of Sm and the content rate of Ga are present on the inside of an area including a borderline that is surrounded by the approximate lines illustrated by oblique lines in FIG. 3, the magnetostriction quantity becomes 400 ppm or greater. That is, if the magnetostrictive material is the FeGaSm alloy that is represented by Expression (1): $Fe_{(100-x-y)}Ga_xSm_y$ . . . (1) (in Expression (1), x and y are respectively the content rate (at. %) of Ga, and the content rate (at. %) of Sm, and satisfy that y≤0.35x−4.2, y≤−x+20.1, and y≥−0.1x+2.1), the magnetostriction quantity becomes 400 ppm or greater.

Figure 4:
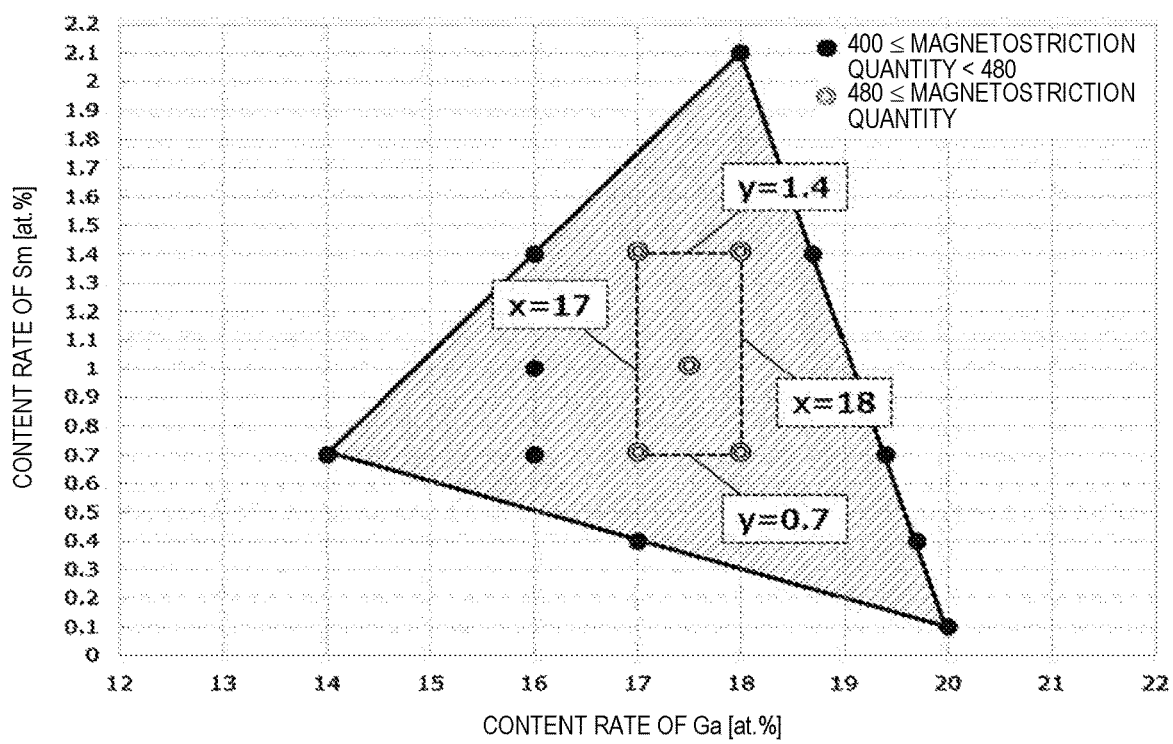
FIG. 4 is a diagram representing the relationship between the content rate of Ga and the content rate of Sm in which the magnetostriction quantity becomes 480 ppm or greater in Example 2 of the present disclosure.

FIG. 4 is a diagram representing the relationship between the content rate of Ga and the content rate of Sm in which the magnetostriction quantity becomes 480 ppm or greater in Example 2 of the present disclosure. Specifically, FIG. 4 is a diagram in which a spot at which the magnetostriction quantity is 480 ppm or greater is particularly represented by a double circle, among the black circles at which the magnetostriction quantities are 400 ppm or greater. As illustrated in FIG. 4, the boundary at which the magnetostriction quantity is 480 ppm or greater is present, in the relationship between the content rate of Sm and the content rate of Ga. If the approximate lines along the boundary are sought, it is found out that x=17, x=18, y=0.7, and y=1.4, respectively. In other words, if the content rate of Sm and the content rate of Ga are present on the inside of the area including a dashed borderline that is surrounded by the approximate lines in the oblique lines of FIG. 4, the magnetostriction quantity becomes 480 ppm or greater. That is, if the magnetostrictive material is the FeGaSm alloy that is represented by Expression (1): $Fe_{(100-x-y)}Ga_xSm_y$ . . . (1) (in Expression (1), x and y satisfy that 17≤x≤18, and 0.7≤y≤1.4), the magnetostriction quantity becomes 480 ppm or greater.

Example 3

In Example 3, various samples in which the inclination angle with respect to the <100> orientation is changed, at the time of cutting out the sample for the measurement of the FeGaSm single crystal alloy are prepared, the magnetostriction quantity is measured, and an influence which the inclination angle with respect to the <100> orientation of the alloy has on the magnetostriction quantity is searched.

Manufacturing of Sample for Measurement of FeGaSm Alloy

As a sample for the measurement, as illustrated in Table 3 later, samples (Example 3-1 to Example 3-6, and Comparative Example 3-1 to Comparative Example 3-2) of the FeGaSm alloys which are configured by the content rate of Ga which is 20 at. %, the content rate of Sm which is 0.1 at. %, and the balance Fe are prepared. The method for manufacturing the sample for the measurement of the FeGaSm single crystal alloy, and the method (wire electric discharge machining) for cutting out the sample for the measurement are the same as those of Example 1 described above.

Measurement and Determination of Magnetostriction Quantity (ppm)

The shape of the sample for the measurement of the magnetostriction quantity (ppm) of each sample is a shape of the diameter of 10 mm×the thickness of 1 mm, and is the same as that of Example 1. However, per sample, the upper surface and the bottom surface (surface that is parallel to a surface which is orthogonal to the thickness direction of the sample) of the sample of which the diameter is 10 mm are cut out to form the different inclination angles as illustrated in Table 3, with respect to the <100> orientation of the single crystal of the FeGaSm alloy. The measurement method of the magnetostriction quantity (ppm) of each sample is the same as the method of Example 1 described above, but even in a case of the sample according to Example 3 which is cut out with the inclination angle, the strain gauge is attached to the upper surface of the sample of which the diameter is 10 mm, in the same manner. Accordingly, the properties of the magnetostriction quantity of the sample are measured such that the maximum strain direction of the magnetostrictive material forms the inclination angle which is the same as that of Table 3, with respect to the pulling-out direction of the magnetostrictive energy. The effectiveness of the magnetostriction quantity (ppm) is determined to be "Good" in a case of 400 ppm or greater, and is determined to be "Poor" in a case of less than 400 ppm.

Table 3 illustrates the measurement result and the determination result of the magnetostriction quantity, in conjunction with the alloy composition and the inclination angle of each sample of the FeGaSm alloy in Example 3-1 to Example 3-6, and Comparative Example 3-1 to Comparative Example 3-2.

TABLE 3

| | Ga [at. %] | Sm [at. %] | Inclination Angle [°] | Magnetostriction Quantity [ppm] | Determination |
|---|---|---|---|---|---|
| Example 3-1 | 20 | 0.1 | 0 | 415 | Good |
| Example 3-2 | 20 | 0.1 | 2 | 416 | Good |
| Example 3-3 | 20 | 0.1 | 4 | 410 | Good |
| Example 3-4 | 20 | 0.1 | 6 | 409 | Good |
| Example 3-5 | 20 | 0.1 | 8 | 405 | Good |
| Example 3-6 | 20 | 0.1 | 10 | 401 | Good |
| Comparative Example 3-1 | 20 | 0.1 | 11 | 396 | Poor |
| Comparative Example 3-2 | 20 | 0.1 | 12 | 393 | Poor |

As illustrated in Table 3, in a case where the content rate of Ga is 20 at. %, and the content rate of Sm is 0.1 at. %, in Example 3-1 to Example 3-6 of which the inclination angle is 0° or greater and 10° or less, the magnetostriction quantity is 400 ppm or greater, and the favorable result is obtained, in comparison with Comparative Example 3-1 to Comparative Example 3-2 having the same alloy composition. This is considered because the easy axis of magnetization of the FeGaSm alloy is the <100> orientation. Accordingly, practically, for example, it is found out to be more useful that the direction in which the dimensional change for extracting the energy of the magnetostriction type device is desired, and the maximum strain direction of the magnetostrictive material are configured to form the inclination angle of 0° or greater and 10° or less, in order to obtain the magnetostrictive properties more efficiently.

Since the magnetostrictive material of the present disclosure exhibits large magnetostriction quantity, and is excellent in mechanical strength, it is possible to apply the magnetostrictive material of the present disclosure to a magnetostriction type vibration power generation device, a magnetostriction type sensor, or a magnetostriction type actuator, thereby assisting in the realization of the IoT.

What is claimed is:

1. A magnetostrictive material comprising:
a FeGaSm alloy that is represented by Expression (1), $$Fe_{(100-x-y)}Ga_xSm_y \tag{1}$$

wherein, in Expression (1), x and y are respectively a content rate (at. %) of Ga and a content rate (at. %) of Sm, and satisfy $17 \leq x \leq 18$ and $0.7 \leq y \leq 1.4$, and
wherein the magnetostrictive material has a magnetostriction quantity of 480 ppm or greater.

2. The magnetostrictive material of claim 1,
wherein an orientation difference of <100> orientation of the FeGaSm alloy is in a range of 0° or greater and 10° or less, with respect to a maximum strain direction of the magnetostrictive material.

3. A magnetostriction type device comprising:
the magnetostrictive material of claim 2,
wherein a maximum strain direction of the magnetostrictive material is configured to form an inclination angle of 0° or greater and 10° or less, with respect to a predetermined direction of a dimensional change of the magnetostriction type device.

4. A magnetostriction type device comprising:
the magnetostrictive material of claim 1,
wherein a maximum strain direction of the magnetostrictive material is configured to form an inclination angle of 0° or greater and 10° or less, with respect to a predetermined direction of a dimensional change of the magnetostriction type device.

* * * * *